United States Patent [19]

Matsuda et al.

[11] Patent Number: 4,833,645
[45] Date of Patent: May 23, 1989

[54] SEMICONDUCTOR MEMORY DEVICE HAVING IMPROVED RESISTANCE TO ALPHA PARTICLE INDUCED SOFT ERRORS

[75] Inventors: Yoshio Matsuda; Kazuyasu Fujishima, both of Hyogo, Japan

[73] Assignee: Mitsubishi Denki Kabushiki Kaisha, Tokyo, Japan

[21] Appl. No.: 929,367

[22] Filed: Nov. 12, 1986

[30] Foreign Application Priority Data

Nov. 13, 1985 [JP] Japan .................. 60-257093

[51] Int. Cl.$^4$ ............... G11C 11/24; G11C 11/34; H01L 29/80; H01L 27/02
[52] U.S. Cl. ............... 365/149; 365/182; 365/205; 357/22; 357/41
[58] Field of Search .......... 365/149, 182, 189, 186, 365/205, 177; 357/22, 41

[56] References Cited

U.S. PATENT DOCUMENTS

| 4,434,433 | 2/1984 | Nishizawa | 365/149 |
| 4,538,166 | 8/1985 | Nakano | 365/149 |

FOREIGN PATENT DOCUMENTS 2841453 10/1982 Fed. Rep. of Germany .
55-146956 3/1979 Japan .
54-606 3/1979 Japan .
55-160463 5/1980 Japan .

OTHER PUBLICATIONS

A. Mohsen et al, High Density, High Performance DRAM Cell, 1982 IEEE, IEDM, vol. 82, pp. 616–619.

Primary Examiner—Terrell W. Fears
Assistant Examiner—Melissa T. Koval
Attorney, Agent, or Firm—Lowe, Price, LeBlanc, Becker & Shur

[57] ABSTRACT

In the semiconductor memory device according to the present invention, a n type drain diffused region (9a) to be connected to a bit line (12) is formed on a p type semiconductor substrate (1) and a n type source diffused region (9b) is formed with a prescribed spacing from the n type drain region (9a). On the p type silicon substrate (1), a p type diffused region (16a) of high impurity density and p type diffused region (16b) of high impurity density are formed in such a manner that they are in contact with the n type drain diffused region (9a) and the n type source diffused region (9b), respectively, but not in the channel region of the n channel MOS transistor (18). Consequently, the α particle-generated charges can be decreased without changing the threshold voltage of the transfer gate transistor.

2 Claims, 3 Drawing Sheets

SEMICONDUCTOR MEMORY DEVICE HAVING IMPROVED RESISTANCE TO ALPHA PARTICLE INDUCED SOFT ERRORS

DESCRIPTION OF THE PRIOR ART

1. Field of the Invention

The present invention relates to a semiconductor memory device. More particularly, the present invention relates to a semiconductor memory device which is improved for eliminating the α particle-induced soft errors in the MOS dynamic RAM.

2. Prior Art

In the MOS dynamic RAM, soft errors induced by α particles emitted from the thorium or uranium included in the packaging materials and the like present a serious problem on reliability. Namely, as memories come to be implemented with larger capacities, the memory cell becomes smaller and the amount of electric charge to be stored in the memory cell decreases, so that the stored information of the memory cell is inverted by the external noise caused by α particles, resulting in soft errors. Mainly two methods are used for preventing such soft errors.

One method is to decrease the number of α particles impinging upon the chip, i.e., more specifically, to protect the chip with a film containing little radiation which do not allow the α particles to penetrate there through or to enhance the purity of the packaging materials. However, the entrance of the α particles can not be perfectly prevented.

The other method is to enhance the stability of the chip itself against the α particles, namely, to increase the memory cell capacitance. By increasing the stored signal amount in relation to the external noise, the chip becomes more stable against soft errors. Therefore, there has been some attempts to increase the memory cell capacitance within the restriction imposed by minimization of the memory cell size.

Meanwhile, the soft errors can be divided into two modes in accordance with the portions where α particles impinge upon. One is a memory cell mode, namely, errors caused by the entrance of the α particle-generated charge into the memory cell. This error do not depend on the memory cycle time. The other is a bit line mode, namely, errors caused by the α particle-generated charge into the bit line after transference of the information from the memory cell to the bit line. This error is proportional to the time when the bit line is floating during the reading operation. FIG. 1 schematically shows the above described relation.

Now, there are two methods to make the chip stable against the soft errors of these two modes. One is to increase the stored charge amount of the memory cell as described above so as to make the same not susceptible to the influence of the α particle-generated charge. The other is to decrease the collection efficiency of the impinged α particle-generated charge. The former method, namely, increasing stored charge amount of the memory cell, has effect on the soft errors of both the memory cell mode and the bit line mode.

FIG. 2 is a cross sectional view showing the structure of a conventional MOS dynamic RAM structured in such a manner that the charge storage amount of the memory cell is increased. The structure of this device will be described. Referring to FIG. 2, a n type drain diffused region 9a is formed on a p type silicon substrate 1. A p+ type diffused region 3 having higher impurity density than the substrate is formed on the p type silicon substrate 1, a n type source diffused region 9b is formed on the p type silicon substrate 1 apart from the n type drain diffused region 9a and, a n type diffused region 4 is formed on the p+ type diffused region 3. 2 is a thick oxide film region for separation. A gate oxide film 7 is formed on the p type silicon substrate 1 between the n type drain diffused region 9a and the n type source diffused region 9b. A gate electrode 8 of polysilicon layer is formed on the gate oxide film 7. The gate electrode 8 is connected to the word line WL. The p type silicon substerate 1, the gate oxide film 7, the gate electrode 8, the n type drain diffused region 9a and the n type source diffused region 9b form a N channel MOS transistor 18 which is a transfer gate transistor.

A MOS capacitor gate oxide film 5 is formed on the n type diffused region 4 and a MOS capacitor electrode 6 of polysilicon layer is formed on the MOS capacitor gate oxide film 5 and the pick oxide film region 2. The n type diffused region 4, MOS capacitor gate oxide film 5 and the MOS capacitor electrode 6 form a MOS capacitor of the capacitance $C_0$ and the n type diffused region 4 becomes one electrode of this capacitor. The junction between the p+ type diffused region 3 and the n type diffused region 4 forms a junction capacitance capacitor of the capacitance $C_J$. The MOS capacitor and the junction capacitance capacitor constitute a memory cell. A silicon oxide film 10 is formed to cover the gate electrode 8 and the MOS capacitor electrode 6. A metal wiring 12 of Al, which is a bit line, is formed on the silicon oxide film. An aperture 11 is provided in the silicon oxide film 10 and the n type drain diffused region 9a is connected to the metal wiring 12 of Al through this aperture.

FIG. 3 is an equivalent circuit diagram of FIG. 2. Referring to FIG. 3, the N channel MOS transistor 18 has its gate connected to the word line WL, its drain connected to the bit line BL and its source connected to one electrode of the MOS capacitor 19 of the capacitance $C_0$ and to one electrode of the junction capacitance capacitor 20 of the capacitance $C_J$, the capacitance of the memory cell being constituted by the parallel capacitance of the capacitance $C_0$ and the capacitance $C_J$. The writing of the information into the memory cell capacitance and the reading of the information from the memory cell are performed by the selection of the word line WL and the bit line BL.

FIGS. 4A to 4E show the manufacturing process of the MOS dynamic RAM shown in FIG. 2.

The method for manufacturing the MOS dynamic RAM will be hereinafter described with reference to FIGS. 4A to 4E. First, as shown in FIG. 4A, a thick oxide film region 2 for separation is formed on the p type silicon substrate 1. Then, as shown in FIG. 4B, a p+ type diffused region 3 and a n type diffused region 4 are formed successively by ion implantation, etc. at the portion corresponding to the lower portion of the MOS capacitor. As shown in FIG. 4C, a MOS capacitor gate oxide film 5 is formed on the n type diffused region 4 and, thereafter, a MOS capacitor electrode 6 is formed on the capacitor gate oxide film 5 and the oxide film region 2 with a first polysilicon layer.

Then, as shown in FIG. 4D, a gate oxide film 7 of the N channel MOS transistor 18 is formed on the p type silicon substrate 1 and then a gate electrode 8 of the N channel MOS transistor 18 is formed on the gate oxide film 7 with a second polysilicon layer and, in addition, a n type drain diffused region 9a and a n type source diffused region 9b are formed on the p type silicon substrate 1. Then, as shown in FIG. 4E, a silicon oxide film 10 is formed to cover the MOS capacitor electrode 6 and the gate electrode 8 and an aperture 11 is formed on the n type drain diffused region 9a of the silicon oxide n film 10. Then the metal wiring 12 of Al is provided to cover the top surface of the device and thus the MOS dynamic RAM of FIG. 2 is obtained.

In this manner, in the conventional MOS dynamic RAM, the stored charge amount of the memory cell is increased by adding the capacitance $C_J$ of the junction capacitance capacitor 20 which is increased by the p+ type diffused region 3 formed below the n type diffused region 4, to the capacitance $C_0$ of the MOS capacitor 19. In addition, the extension of the depletion layer region between the p type silicon substrate 1 and the n type source diffused region 9b can be prevented by the p+ diffused region 3, so that the soft errors in the memory cell mode, which is generated due to the collection of $\alpha$ particle-generated charges from the depletion layer region to the n type diffused region 4 and to the n type source diffused region 9b, is decreased.

In addition, as the storage charge amount of the memory cell can be represented by the product of the potential of the storage node of the memory cell (in FIG. 2, the potential of the n type source diffused region 9b) and the memory cell capacitance, the stored charge amount of the memory cell is decreased by raising the potential of the storage node.

In a conventional MOS dynamic RAM as described above, thinning the capacitor gate oxide film 5 in order to increase the stored charge amount of the memory cell in the minimized size has a limit in view of its reliability. Although the above described structure can decrease the soft errors of the memory cell mode, the decrease of the soft errors of bit line mode is not sufficient. In the above described structure, the depletion layer region is likely to extend between the p type silicon substrate 1 and the n type drain diffused region 9a, so that the $\alpha$ particle-generated charge is collected from this depletion layer region to the n type drain diffused region 9a causing soft errors of the bit line mode.

SUMMARY OF THE INVENTION

Therefore, it is a principal object of the present invention to provide a semiconductor memory device which is capable of decreasing the soft errors of bit line mode.

Briefly stated, in the present invention, a first semiconductor region of a second conductivity type to be connected to the bit line is formed on a semiconductor substrate of a first conductivity type and a second semiconductor region of the second conductivity type is also formed on the semiconductor substrate of the first conductivity type with a prescribed spacing from the first semiconductor region. The second semiconductor region includes in its portion a charge storage region for storing information. In addition, a third semiconductor region of the first conductivity type having higher impurity density than the semiconductor substrate is formed on the semiconductor substrate such that it is in contact with the first semiconductor region of the second conductivity type but not in the channel region of the transistor and a fourth semiconductor region of the first conductivity type having higher impurity density than the semiconductor substrate is also formed on the semiconductor substrate such that it is in contact with the second semiconductor region but not in the channel region of the transistor.

Therefore, according to the present invention, the $\alpha$ particle-generated charge collected from the depletion layer region to the bit line region can be decreased without changing the threshold voltage of the transfer gate transistor, thereby decreasing the soft errors of the bit line mode.

In a preferred embodiment of the present invention, the impurity density of the third and fourth semiconductor regions of the first conductivity type is selected to be $10^{16}$ to $10^{18}/cm^3$.

In a more preferred embodiment of the present invention, a fifth semiconductor region of the second conductivity type of the sense amplifier portion connected to the bit line is formed on the semiconductor substrate and a sixth semiconductor region of the first conductivity type having higher impurity density than the semiconductor substrate is also formed on the semiconductor substrate such that it is in contact with the fifth semiconductor region but not in the channel region of the transistor. The impurity density of the sixth semiconductor region is selected to be $10^{16}$ to $10^{18}/cm^3$.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
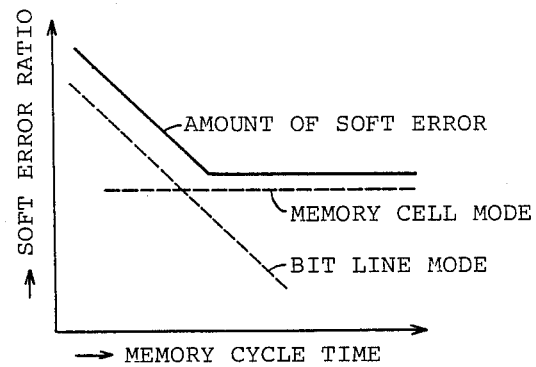
FIG. 1 is a graph showing the relation between the memory cycle time and the soft error ratio in a conventional semiconductor memory device.
Figure 2:
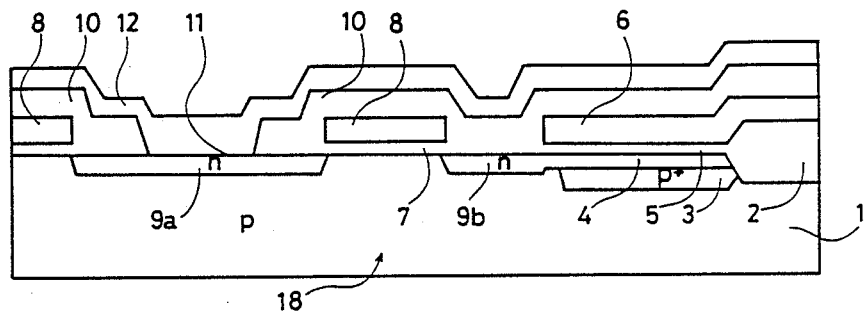
FIG. 2 is a cross sectional view showing the structure of a conventional MOS dynamic RAM.
Figure 3:
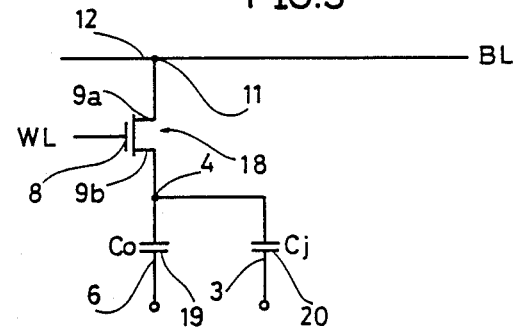
FIG. 3 is an equivalent circuit diagram of FIG. 2.
Figure 5:
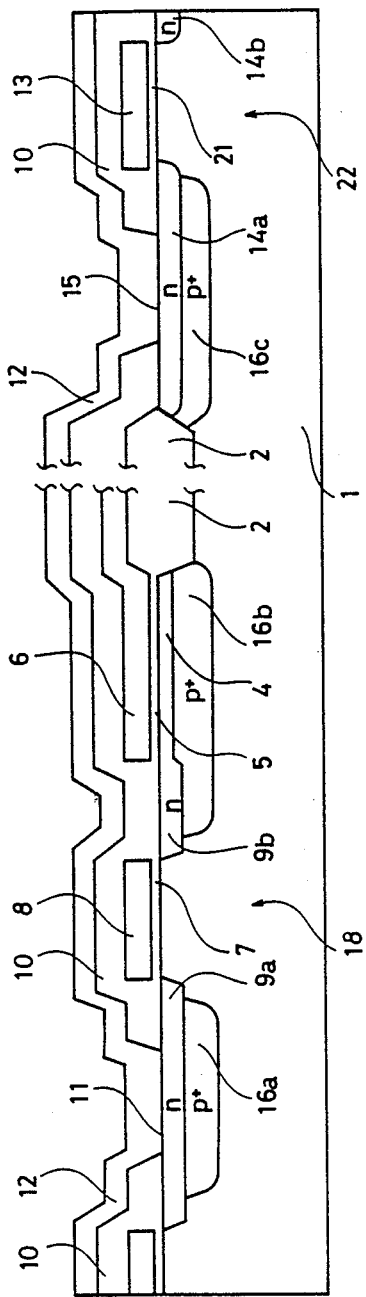
FIG. 5 is a cross sectional view showing the structure of one embodiment of the present invention.

FIG. 5 is a cross sectional view showing the structure of a semiconductor memory device according to one embodiment of the present invention. The structure of this embodiment differs from the aforementioned structure of FIG. 2 in the following points. Namely, a p+ type diffused region 16a, which is the third semiconductor region having higher impurity density than the p type silicon substrate 1, is formed on the p type silicon substrate 1 in such a manner that it is in contact with the n type drain diffused region 9a but not in the channel region of the n channel MOS transistor 18 which is a transfer gate transistor. In addition, a p+ type diffused region 16b, which is the fourth semiconductor region having higher impurity density than the p type silicon substrate 1, is formed on the p type silicon substrate 1 in such a manner that it is in contact with the n type diffused region 4 and a n type source diffused region 9b but not in the channel region of the n channel MOS transistor 18 which is a transfer gate transistor.

The junction of the p+ type diffused region 16b, n type diffused region 4 and n type source diffused region 9b constitute a junction capacitance capacitor of a capacitance $C_J'$ and this junction capacitance capacitor and a MOS capacitor form a memory cell. In addition, a p+ type diffused region 16c, which is the sixth semiconductor region having higher impurity density than the p type silicon substrate 1 is formed on the substrate and a n type drain diffused region 14a, which is the fifth semiconductor region, is formed on the p+ type diffused region 16c. A n type source diffused region 14b is formed on the p type silicon substrate 1 being spaced apart from the n type drain diffused region 14a.

A gate oxide film 21 is formed on the p type silicon substrate 1 between the n type drain diffused region 14a and the n type source diffused region 14b and a gate electrode 13 of the polisilicon layer is formed on this gate oxide film 21. The p type silicon substrate 1, the gate oxide film 21, the gate electrode 13, the n type drain diffused region 14a and the n type source diffused region 14b form a n channel MOS transistor 22 of the sense amplifier portion. The p+ type diffused region 16c is formed in such a manner that it does not enter the channel region of the n channel MOS transistor 22. The impurity density of the p+ type diffused regions 16a, 16b and 16c is preferably in the range of $10^{16}$ to $10^{18}/cm^3$. A silicon oxide film 10 is formed to cover the gate electrode 13 and a metal wiring 12 of Al, which is a bit line, is formed on this silicon oxide film 10. An aperture 15 is provided in the silicon oxide film 10 and the n type drain diffused region 14a is connected to the metal wiring 12 of Al through this aperture 15.

Figure 6:
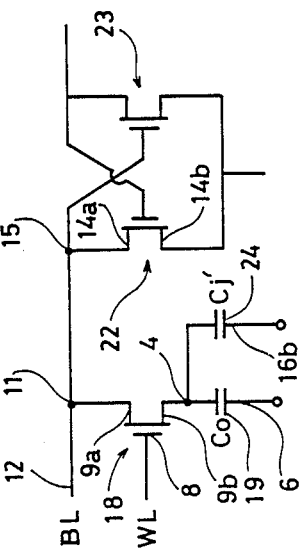
FIG. 6 is an equivalent circuit diagram of FIG. 5.

FIG. 6 is an equivalent circuit diagram of FIG. 5. Referring to FIG. 6, the n channel MOS transistor 18 has its gate connected to the word line WL, its drain connected to the bit line BL and its source connected to one electrode of the MOS capacitor 19 having the capacitance of $C_0$ and to one electrode of the junction capacitance capacitor 24 having the capacitance of $C_j'$ and the capacitance of the memory cell is constituted by the parallel capacitance of the capacitance $C_0$ and the capacitance $C_j'$. The n channel MOS transistor 22 in the sense amplifier portion has its drain connected to the bit line BL and its source connected to the source of a n channel MOS transistor 23 (not shown in FIG. 5) in the sense amplifier portion.

Figure 4A:
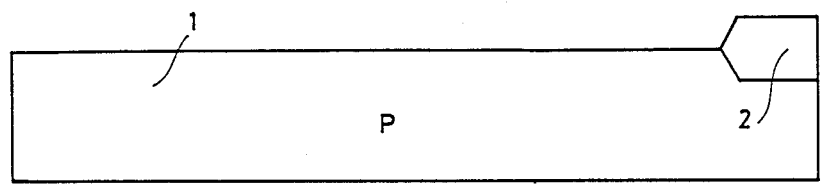
FIGS. 4A to 4E show the manufacturing process of the MOS dynamic RAM shown in FIG. 2.
Figure 4B:
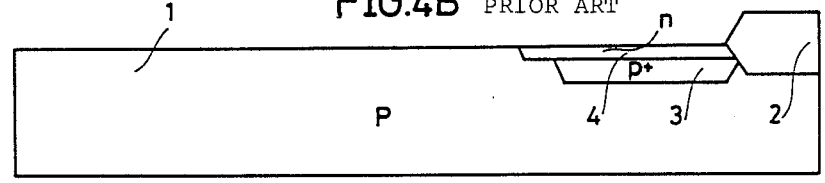
Figure 4C:
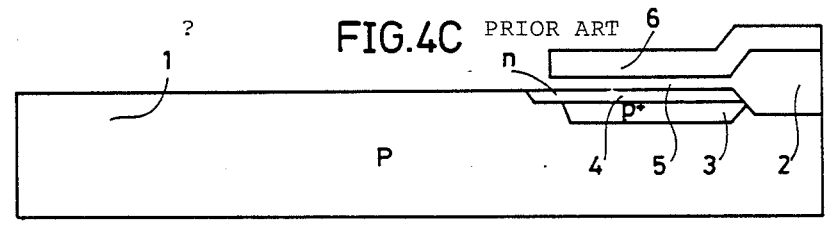
Figure 4D:
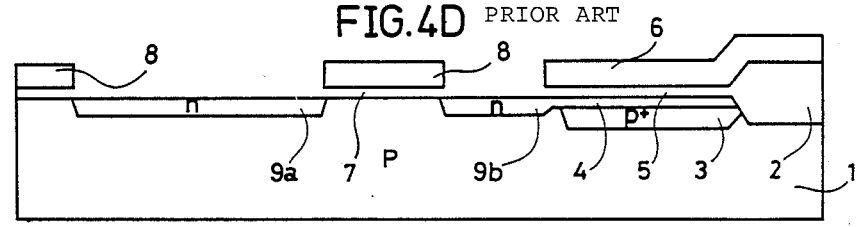
Figure 4E:
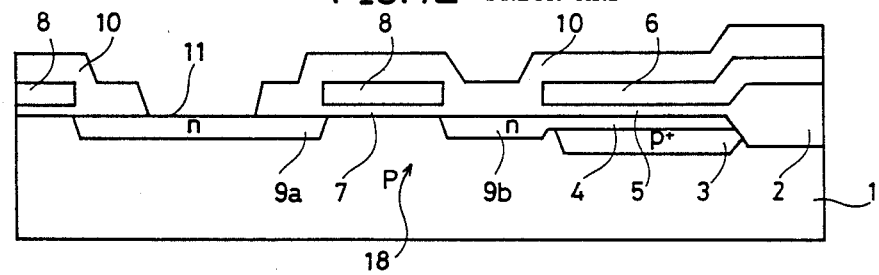

The method for manufacturing the semiconductor memory device will be hereinafter described with reference to FIGS. 4A to 4E. As shown in FIG. 4B, a thick oxide film region 2 is formed on the p type semiconductor substrate 1 and then, the p+ type diffused regions 16a, 16b and 16c shown in FIG. 5 are simultaneously formed on the p type semiconductor substrate 1 by diffusion or ion implantation using a mask and thereafter a n type diffused region 4 is formed on the p+ type diffused region 16b. Then, a MOS capacitor gate oxide film 5 is formed on the n type diffused region 4 and a MOS capacitor electrode 6 of a first polysilicon layer is formed on the gate oxide film 5. Then, gate oxide films 7 and 21 are formed on the p type semiconductor substrate 1. Then, gate electrodes 8 and 13 of a second polysilicon layer are formed on the gate oxide films 7 and 21, respectively. Then the n type drain diffused region 9a is formed on the p+ type diffused region 16a, the n type source diffused region 9b is formed on the p+ type diffused region 16b the n type drain diffused region 14a is formed on the p+ type diffused region 16c, the n type source diffused region 14b is formed on the p type semiconductor substrate 1 and then a silicon oxide film 10 is formed to cover the entire device. Then, apertures 11 and 15 are formed on the silicon oxide film 10 and thereafter a metal wiring 12 Al is formed to cover the entire device.

Thus, p+ type diffused regions 16a, 16b and 16c are respectively formed below the n type drain diffused region 9a, the n type source diffused region 9b and the n type drain diffused region 14a, so that the depletion layer between the p type silicon substrate 1 and the n type drain diffused region 9a, the n type source diffused region 9b and the n type drain diffused region 14a is not likely to extend into the side of the p type silicon substrate 1.

As described above, in the α particle-generated charges, those in the depletion layer region are collected into the bit line region (here the n type drain diffused regions 9a and 14a) to cause the soft errors of bit line mode while those out of the depletion layer region do not cause the soft errors of the bit line mode except those having reached the depletion layer region by diffusion to be collected in the bit line region. Therefore, by depressing the extension of the depletion layer region by the p+ type diffused region 16a and 16c, as in this embodiment, the number of α particle-generated charge to be collected in the n drain diffused regions 9a and 14a, which are to be the bit line region, decreases, thereby preventing the occurrence of the soft errors of the bit line mode. In addition, due to the difference of the impurity density, there arises a potential barrier against electrons between the p type silicon substrate 1 and the p+ type diffused regions 16a, 16b and 16c, so that the α particle-generated charges are not easily collected in the bit line region or in the memory cell. Furthermore, the threshold voltages of the transistors are not influenced since the p+ type diffused regions 16a, 16b and 16c are formed with a mask in such a manner that they do not enter the channel regions of the transfer gate transistors and the transistor in the sense amplifier portion.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A MOS semiconductor memory device, comprising:
   a bit line (12);
   a semiconductor substrate (1) of a first conductivity type;
   a first MOS transistor (18) including first and second source/drain portions (9a, 9b), said first source/drain portion (9a) of said SOS transistor (18) including a first semiconductor region (9a) of a second conductivity type formed on said semiconductor substrate and connected to said bit line, said second source/drain portion (9b) of said MOS transistor (18) including a second semiconductor region (9b) of said second conductivity type formed on said semiconductor substrate with a prescribed spacing from said first semiconductor region of the second conductivity type, said second semiconductor region having a charge storage region for storing information;
   a third semiconductor region (16a) of said first conductivity type and having a higher impurity density than said semiconductor substrate, said third semiconductor region formed on said semiconductor substrate in such a manner that said third region is in contact with said first semiconductor region (9a) of said second conductivity type, at a location outside a channel region of said transistor;

a fourth semiconductor region (16b) of said first conductivity type having a higher impurity density than said semiconductor substrate, said fourth semiconductor region formed on said semiconductor substrate in such a manner than said fourth region is in contact with said second semiconductor region of the said second conductivity type, at a location outside the channel region of said transistor;

a sense amplifier portion including a second MOS transistor (22) having a source/drain portion (14a) connected to said bit line (12), said sense amplifier source/drain portion (14a) including a fifth semiconductor region (14a) of said second conductivity type formed on said semiconductor substrate and connected to said bit line to form said sense amplifier portion; and a sixth semiconductor region (16c) of said first conductivity type and having higher impurity density than said semiconductor substrate said sixth semiconductor region formed on said semiconductor substrate in such a manner that said sixth semiconductor region is in contact with said fifth semiconductor region of said second conductivity type and outside the channel region of said transistor.

2. A semiconductor memory device according to claim 1, wherein the impurity density of said sixth semiconductor region of the first conductivity type is $10^{16}$ to $10^{18}/cm^3$.

* * * * *